(12) United States Patent
Park

(10) Patent No.: US 10,028,383 B2
(45) Date of Patent: Jul. 17, 2018

(54) CONNECTOR, CIRCUIT BOARD MODULE AND CIRCUIT BOARD MODULE ARRAY INCLUDING SAME

(71) Applicant: LG INNOTEK CO., LTD., Seoul (KR)

(72) Inventor: Jun Seok Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/120,210

(22) PCT Filed: Feb. 13, 2015

(86) PCT No.: PCT/KR2015/001450
§ 371 (c)(1),
(2) Date: Aug. 19, 2016

(87) PCT Pub. No.: WO2015/126101
PCT Pub. Date: Aug. 27, 2015

(65) Prior Publication Data
US 2017/0064827 A1    Mar. 2, 2017

(30) Foreign Application Priority Data

Feb. 21, 2014    (KR) .................. 10-2014-0020291

(51) Int. Cl.
*H05K 1/11* (2006.01)
*H05K 1/14* (2006.01)
(Continued)

(52) U.S. Cl.
CPC .......... *H05K 1/142* (2013.01); *H01R 12/721* (2013.01); *H01R 12/732* (2013.01); *H05K 3/368* (2013.01);
(Continued)

(58) Field of Classification Search
CPC ................ H05K 1/14; H05K 1/144; H05K 2201/09172; H05K 2201/10515;
(Continued)

(56) References Cited

U.S. PATENT DOCUMENTS 4,289,366 A * 9/1981 Marks .................... H01R 24/84
439/293
4,931,021 A * 6/1990 Mohan ................. G02B 6/3833
439/284

(Continued)

FOREIGN PATENT DOCUMENTS

JP          11-45767 A      2/1999
KR    10-2006-0077693 A    7/2006
(Continued)

*Primary Examiner* — Chau N Nguyen
*Assistant Examiner* — Roshn Varghese
(74) *Attorney, Agent, or Firm* — Birch, Stewart, Kolasch & Birch, LLP

(57) ABSTRACT

In one embodiment, provided is a connector comprising: a body; a first protrusion formed on a first surface of the body; a first groove formed on the first surface of the body to be adjacent to the first protrusion, and of which the shape includes the inverse of the first protrusion; a first terminal of which at least a portion is arranged to correspond to the first protrusion; and a second terminal of which at least a portion is arranged to correspond to the first groove.

10 Claims, 9 Drawing Sheets

(51) Int. Cl.
- H01R 12/72 (2011.01)
- H01R 12/73 (2011.01)
- H05K 3/36 (2006.01)
- H05K 3/34 (2006.01)
- H01L 33/62 (2010.01)
- H01R 24/84 (2011.01)
- H01R 103/00 (2006.01)
- H05K 1/18 (2006.01)

(52) U.S. Cl.
CPC .............. *H01L 33/62* (2013.01); *H01R 24/84* (2013.01); *H01R 2103/00* (2013.01); *H05K 1/181* (2013.01); *H05K 3/3405* (2013.01); *H05K 2201/09145* (2013.01); *H05K 2201/09163* (2013.01); *H05K 2201/10106* (2013.01); *H05K 2201/10113* (2013.01); *H05K 2201/10189* (2013.01)

(58) Field of Classification Search
CPC ... H05K 2201/09181; H05K 2201/209; H01R 23/7068; H01R 24/84
USPC .......... 361/785, 790, 791; 439/65, 325, 328, 439/620.16
See application file for complete search history.

(56) References Cited

U.S. PATENT DOCUMENTS

| | | | | |
|---|---|---|---|---|
| 6,045,371 | A * | 4/2000 | Kagawa | H01R 12/57 439/74 |
| 6,188,028 | B1 * | 2/2001 | Haba | H05K 3/325 439/66 |
| 7,499,282 | B1 * | 3/2009 | Loucks | G06F 1/1626 361/730 |
| 7,744,264 | B2 * | 6/2010 | Tsao | F21S 2/005 362/368 |
| 8,727,790 | B1 * | 5/2014 | Bishop | H01R 12/732 439/65 |
| 2007/0155194 | A1 * | 7/2007 | Vega Martinez | H05K 1/142 439/62 |
| 2011/0014820 | A1 | 1/2011 | Ito | |
| 2012/0073864 | A1 * | 3/2012 | Stefanoff | H05K 1/142 174/252 |
| 2013/0223068 | A1 | 8/2013 | Choi | |

FOREIGN PATENT DOCUMENTS

| | | |
|---|---|---|
| KR | 10-2008-0077827 A | 8/2008 |
| KR | 10-2012-0050287 A | 5/2012 |
| KR | 10-2012-0080847 A | 7/2012 |
| WO | WO2008/134809 A1 * | 11/2008 |

* cited by examiner

[Fig. 4a]
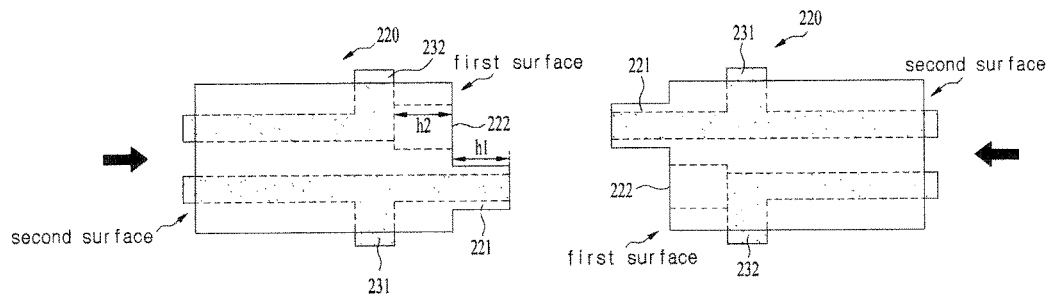
[Fig. 4b]
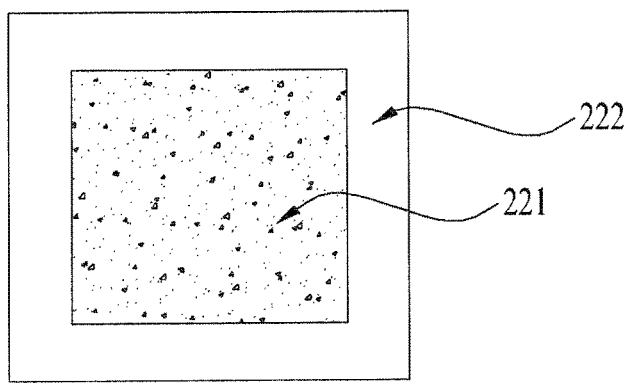
[Fig. 5a]
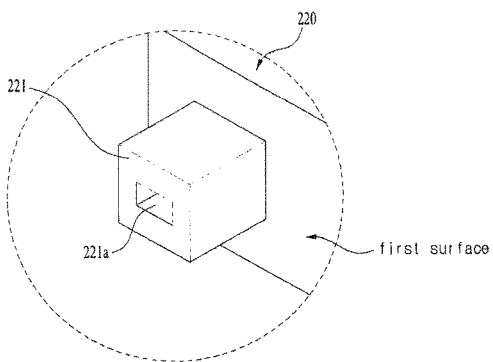

[Fig. 5b]
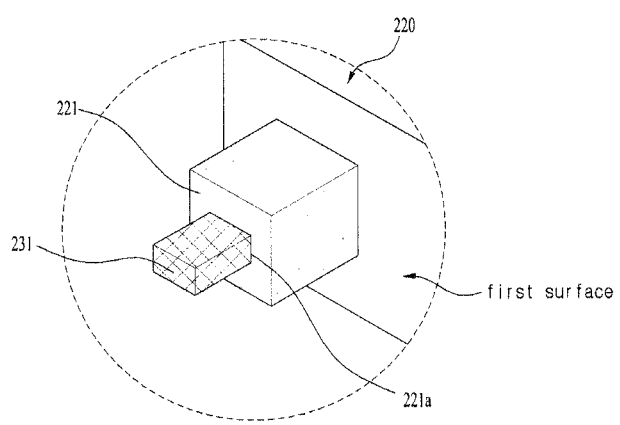
[Fig. 6a]
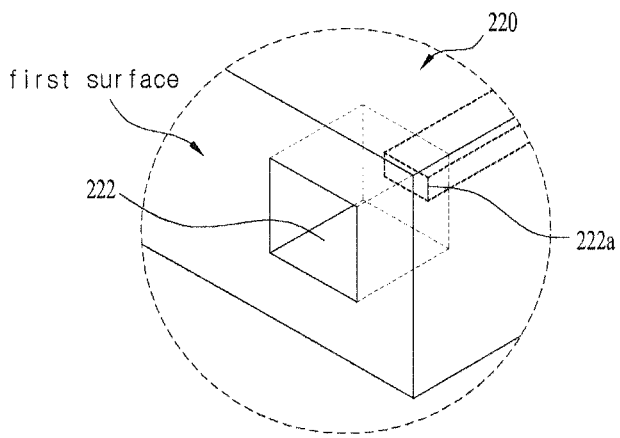

【Fig. 6b】
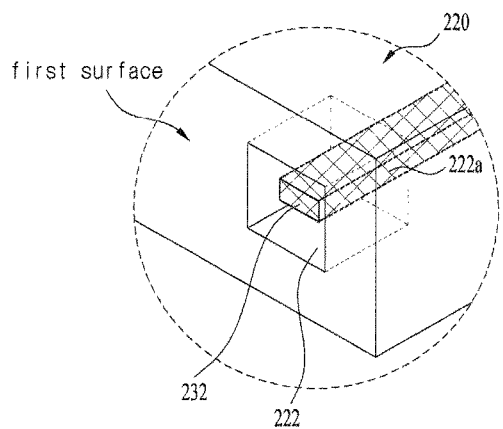
【Fig. 7a】
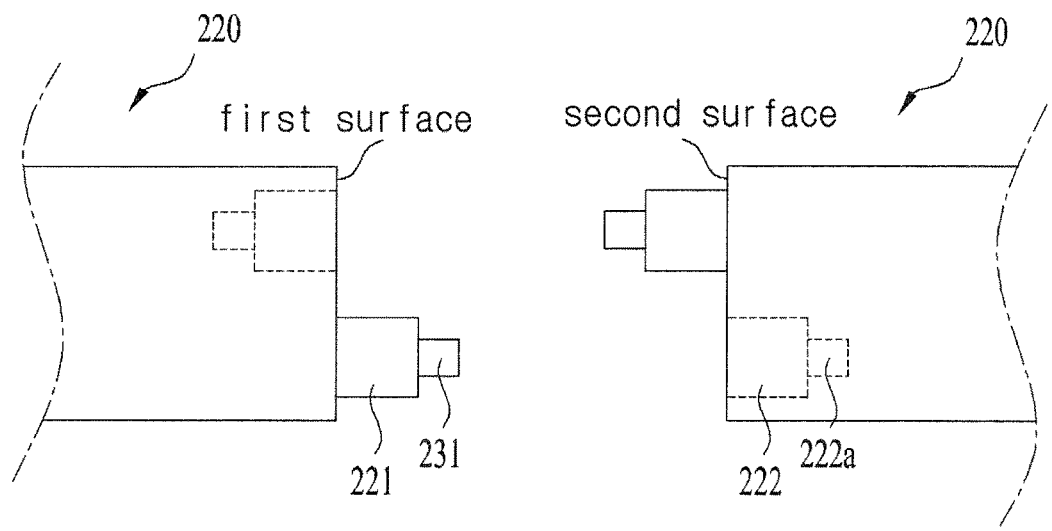

【Fig. 7b】
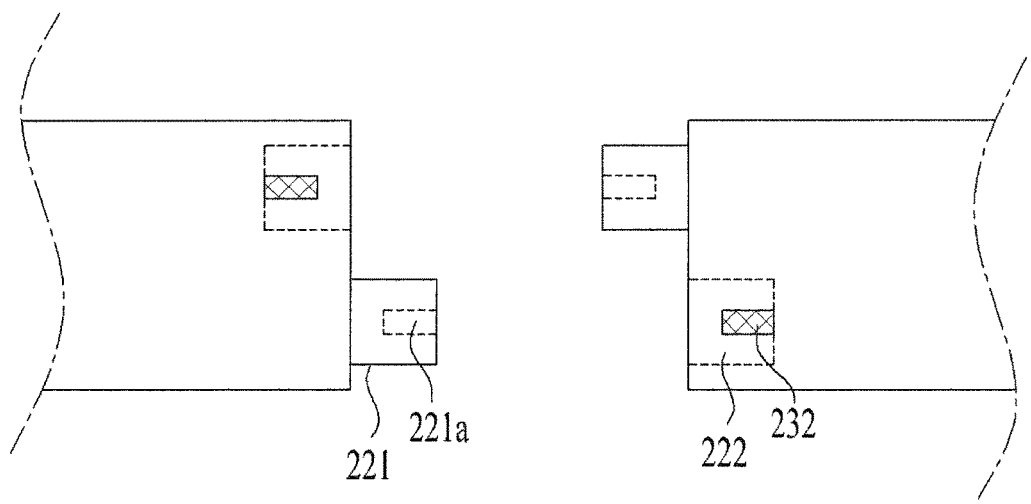
【Fig. 8a】
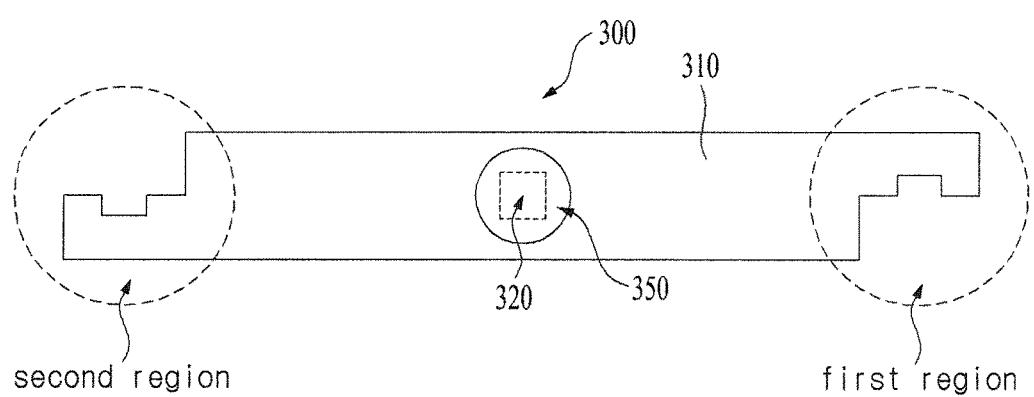

[Fig. 8b]
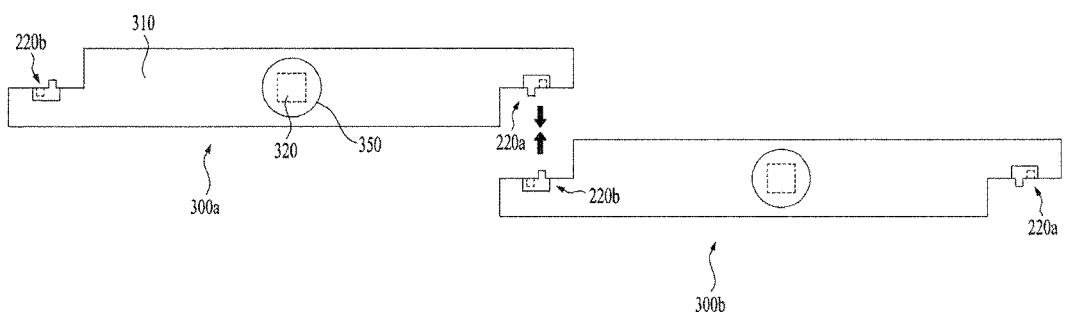
[Fig. 9]
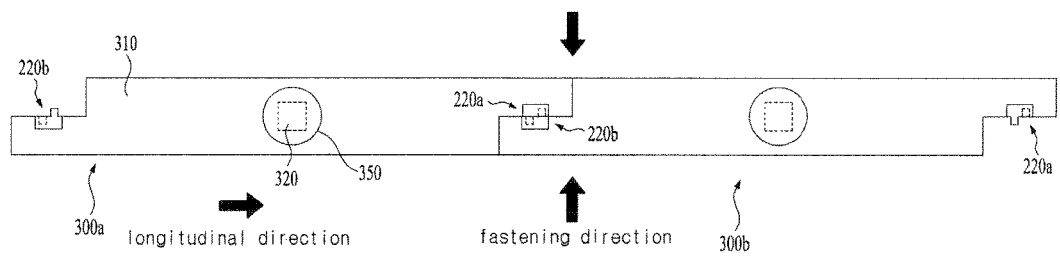
[Fig. 10a]
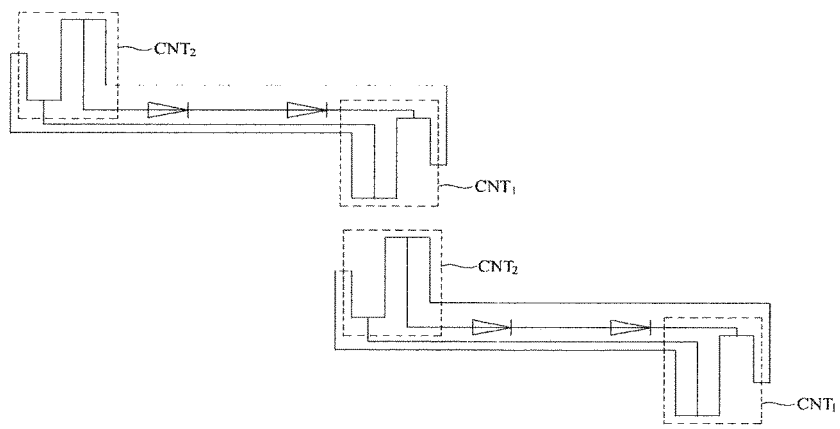

[Fig. 10b]
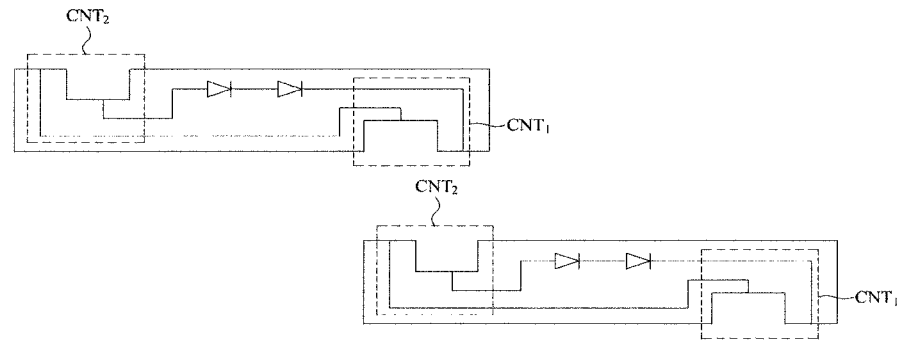
[Fig. 11a]
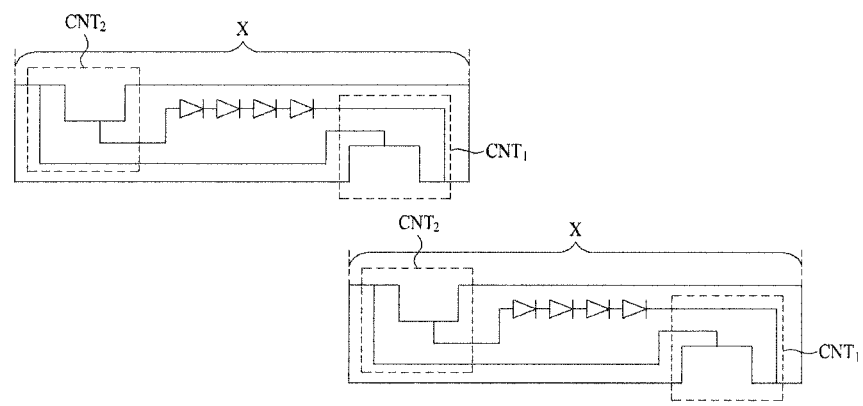
[Fig. 11b]
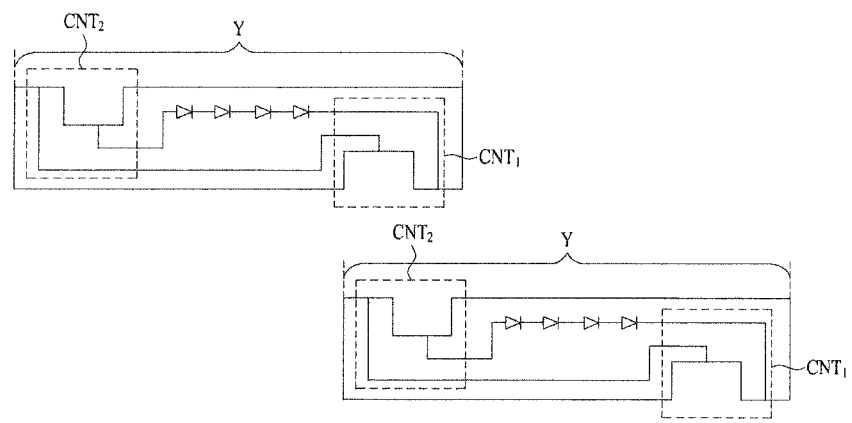

【Fig. 11c】
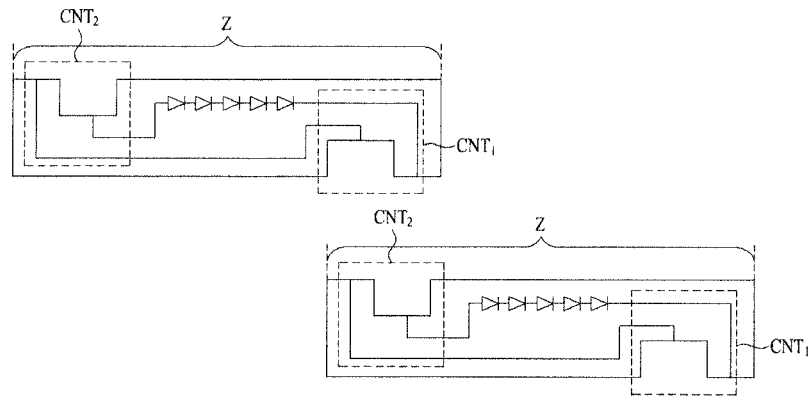
【Fig. 12a】
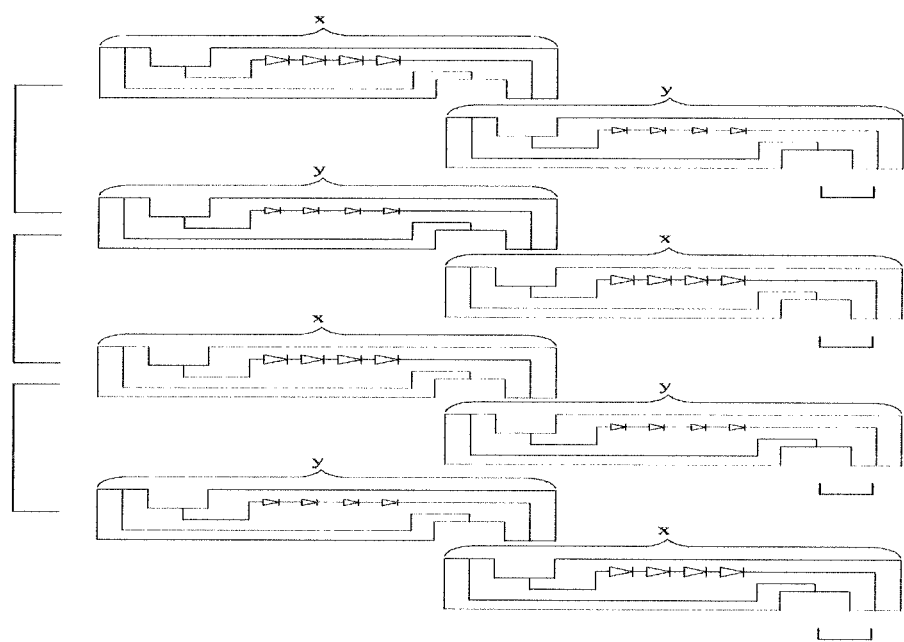

[Fig. 12b]
[Fig. 12c]
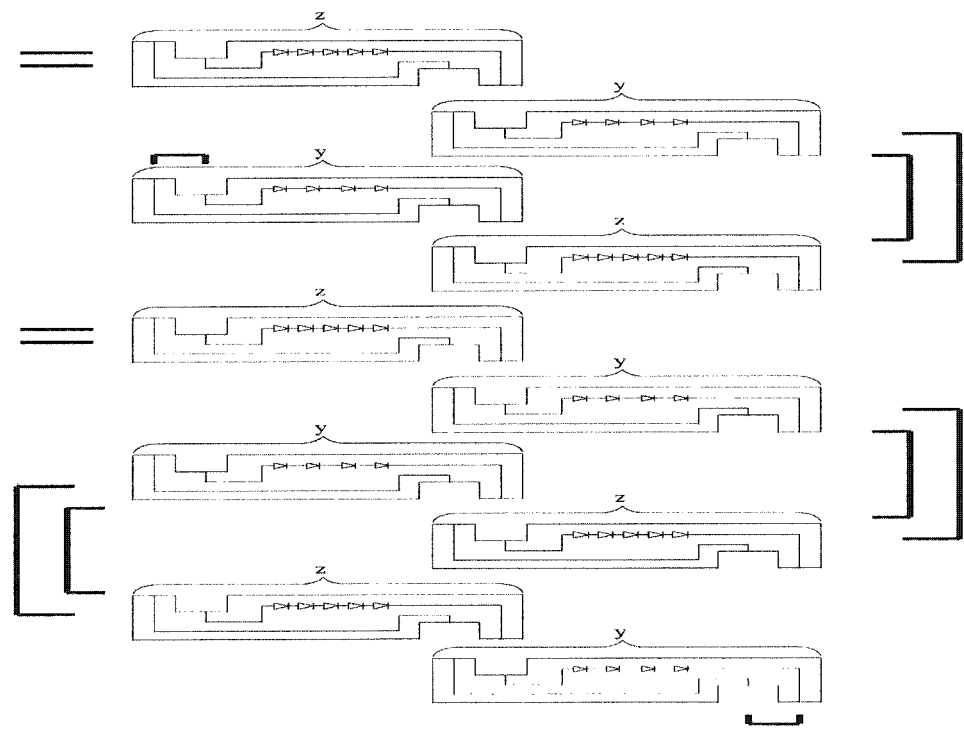

CONNECTOR, CIRCUIT BOARD MODULE AND CIRCUIT BOARD MODULE ARRAY INCLUDING SAME

CROSS REFERENCE TO RELATED APPLICATIONS

This application is the National Phase of PCT/KR2015/001450 filed on Feb. 13, 2015, which claims priority under 35 U.S.C. § 119(a) to Korean Patent Application No. 10-2014-0020291 filed on Feb. 21, 2014, all of which are hereby expressly incorporated by reference into the present application.

TECHNICAL FIELD

Embodiments relate to a connector, a circuit board module and a circuit board module array including the same.

BACKGROUND ART

Group III-V compound semiconductors such as GaN and AlGaN are widely used in lamps for optoelectronics and electronic devices owing to many advantages associated with having wide and adjustable band gap energy.

In particular, light emitting devices, such as light emitting diodes (LEDs) and laser diodes (LDs), which use Group III-V or Group II-VI compound semiconductor materials, may render various colors such as red, green, blue, and ultraviolet by virtue of development of thin film growth technologies and device materials. It may also be possible to produce white light at high efficiency using fluorescent materials or through color mixing. Furthermore, the light emitting devices have advantages, such as low power consumption, semi-permanent lifespan, fast response time, safety, and environmental friendliness, compared to conventional light sources such as fluorescent lamps and incandescent lamps.

Accordingly, these light emitting devices are increasingly applied to transmission modules of optical communication units, light emitting diode backlights as replacements for cold cathode fluorescent lamps (CCFLs) constituting backlights of liquid crystal display (LCD) devices, and lighting apparatuses using white light emitting diodes as replacements for fluorescent lamps or incandescent lamps, headlights for vehicles, and traffic lights.

When light emitting diodes are used for backlight units or the like, at least one light emitting diode package is disposed on each circuit board module, and the circuit board modules are electrically connected to one another by connectors, thereby forming a circuit board module array.

FIG. 1 is a view illustrating a conventional circuit board module array. FIG. 2 is a view illustrating connectors in FIG. 1.

As illustrated in FIG. 1, the circuit board module array consists of adjacent circuit board modules 100a and 100b, and each of the circuit board modules 100a and 100b includes a light emitting device package 150 disposed on a circuit board 110.

A pair of connectors 120 and 130 is disposed at both ends of the circuit board 110, and a pair of terminals 125 and a pair of terminals 135 are inserted into the respective connectors 120 and 130 to be disposed therein.

FIG. 1 illustrates the state in which the connectors 120 and 130 are coupled to each other in region "A".

As illustrated in FIG. 2, when the connectors 120 and 130 are coupled to each other, the terminals 125 and 135 in the respective connectors 120 and 130 are electrically interconnected, and thus the adjacent circuit board modules 100a and 100b may be electrically connected to each other.

However, the above-mentioned conventional circuit board module array and connectors are problematic for the follows reasons.

First, heat is generated when current flows in the circuit board module, and the board or connectors may expand or contract depending on the change in heat generation. Therefore, the connectors may be unstably fastened to each other, and the coupled connectors 120 and 130 may be decoupled from each other. In addition, the connectors 120 and 130 may be decoupled from each other when force is longitudinally applied to the circuit board from the outside.

Secondly, the connectors are fastened to each other by inserting a portion of one connector 120 into the other connector 130, as illustrated in the drawings. In this case, an error may occur in the process in which, when many boards are interconnected, the connectors 120 and 130 having two different shapes are differentially arranged depending on the directions of the boards.

DISCLOSURE

Technical Problem

Embodiments aim to stably fasten connectors between circuit board module arrays and enhance convenience of use of connectors.

Technical Solution

In accordance with an embodiment, a connector includes a body, a first protrusion formed on a first surface of the body, a first groove formed in the first surface of the body to be adjacent to the first protrusion, and having a shape that is an inverse of that of the first protrusion, a first terminal, at least a portion of which is arranged to correspond to the first protrusion, and a second terminal, at least a portion of which is arranged to correspond to the first groove.

The first protrusion may have an open region formed therein, and the first terminal may protrude from the open region.

The first protrusion may have an open region formed therein, and the open region may have a cross-sectional area greater than that of the second terminal.

The first protrusion may have an open region formed therein, and a portion of a second terminal of an adjacent connector may be inserted into the open region.

The first protrusion may have an open region formed therein, and the open region may pass through the body.

The first groove may have an open region formed therein, and the second terminal may protrude from the open region.

The first groove may have an open region formed therein, and the open region may have a cross-sectional area greater than that of the first terminal.

The first groove may have an open region formed therein, and a portion of a first terminal of an adjacent connector may be inserted into the open region.

Currents having different polarities may flow in the first and second terminals.

The first protrusion may have a height greater than a depth of the first groove.

The first protrusion and the first groove may be symmetrically arranged on a center of the first surface.

In accordance with another embodiment, a circuit board module includes a circuit board formed with a first conductive pattern and a second conductive pattern, and connectors arranged in first and second regions of the circuit board, each of the connectors including a body, a first protrusion formed on a first surface of the body, a first groove formed in the first surface of the body to be adjacent to the first protrusion, and having a shape that is an inverse of that of the first protrusion, a first terminal, at least a portion of which is arranged to correspond to the first protrusion, and a second terminal, at least a portion of which is arranged to correspond to the first groove, wherein the connector arranged in the first region and the connector arranged in the second region of the circuit board are respectively referred to as a first connector and a second connector, the first terminal of the first connector is electrically connected to the first conductive pattern, and the second terminal of the first connector is electrically connected to the second conductive pattern.

The second terminal of the second connector may be electrically connected to the first conductive pattern, and the first terminal of the second connector may be electrically connected to the second conductive pattern.

At least one of the first protrusions and grooves of the first and second connectors may be arranged perpendicular to a longitudinal direction of the circuit board.

At least one of the first and second terminals of the first and second connectors may be arranged perpendicular to a longitudinal direction of the circuit board.

In accordance with a further embodiment, a circuit board module array includes a plurality of circuit board modules arranged adjacent to each other, wherein each of the circuit board modules includes a circuit board formed with a first conductive pattern and a second conductive pattern, and connectors arranged in first and second regions of the circuit board, each of the connectors including a body, a first protrusion formed on a first surface of the body, a first groove formed in the first surface of the body to be adjacent to the first protrusion, and having an inverse shape to that of the first protrusion, a first terminal, at least a portion of which is arranged to correspond to the first protrusion, and a second terminal, at least a portion of which is arranged to correspond to the first groove, wherein the connector arranged in the first region and the connector arranged in the second region of the circuit board are respectively referred to as a first connector and a second connector, the first terminal of the first connector is electrically connected to the first conductive pattern, and the second terminal of the first connector is electrically connected to the second conductive pattern, and wherein when the circuit boards are referred to as first and second circuit boards, the first connector in the first region of the first circuit board is fastened to the second connector in the second region of the second circuit board, the first protrusion of the first connector is inserted into the first groove of the second connector, and the first protrusion of the second connector is inserted into the first groove of the first connector.

Advantageous Effects

In accordance with embodiments, each connector has at least one pair consisting of a protrusion and a groove formed in one surface thereof, and therefore adjacent circuit boards can be interconnected using a pair of connectors having the same structure.

In a circuit board module array, the direction in which the adjacent circuit boards come into contact with each other is approximately perpendicular to the coupling or fastening direction of the connectors. Therefore, the fastening between the connectors cannot be weak even when the circuit boards thermally expand due to the current flowing in the circuit boards.

DESCRIPTION OF DRAWINGS

FIG. 4A is a view illustrating the coupling of the connectors in FIG. 3.

FIG. 4B is a view illustrating cross-sectional areas of a first protrusion and a first groove of the connector in FIG. 3.

FIGS. 5A and 5B are views illustrating the shape of the first protrusion of the connector in FIG. 3 in detail.

FIGS. 6A and 6B are views illustrating the shape of the first groove of the connector in FIG. 3 in detail.

FIGS. 7A and 7B are views illustrating the coupling of the first protrusion and the first groove in FIGS. 5A to 6B.

FIG. 8A is a view illustrating one circuit board module in which the connectors in FIG. 3 are arranged.

FIG. 8B is a view illustrating the coupling of the circuit board modules in FIG. 8A.

FIG. 9 is a view illustrating a circuit board module array according to an embodiment.

FIGS. 10A and 10B are views illustrating the wiring of the circuit board module array.

FIGS. 11A to 11C are views illustrating various examples of circuit board module arrays.

FIGS. 12A to 12C are views illustrating a structure in which the circuit board module arrays in FIGS. 11A to 11C are arranged in a backlight unit.

BEST MODE

Reference will now be made in detail to the exemplary embodiments of the present disclosure, examples of which are illustrated in the accompanying drawings.

It will be understood that when an element is referred to as being "on" or "under" another element, it can be directly on/under the element, and one or more intervening elements may also be present. When an element is referred to as being "on" or "under", "under the element" as well as "on the element" can be included based on the element.

Figure 1:
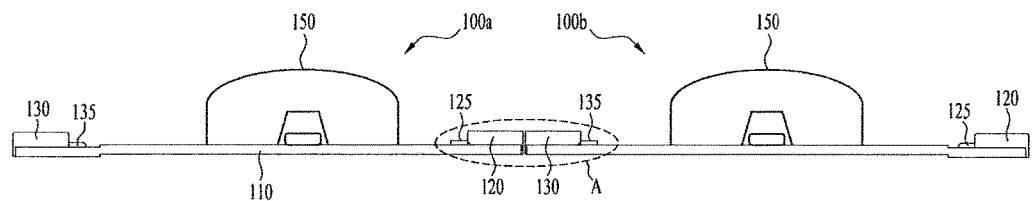
FIG. 1 is a view illustrating a conventional circuit board module array.
Figure 2:
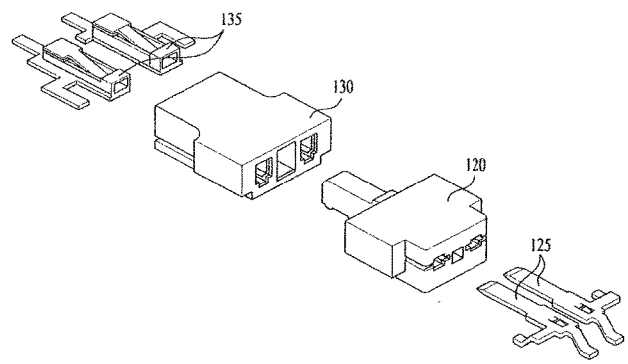
FIG. 2 is a view illustrating connectors in FIG. 1.
Figure 3:
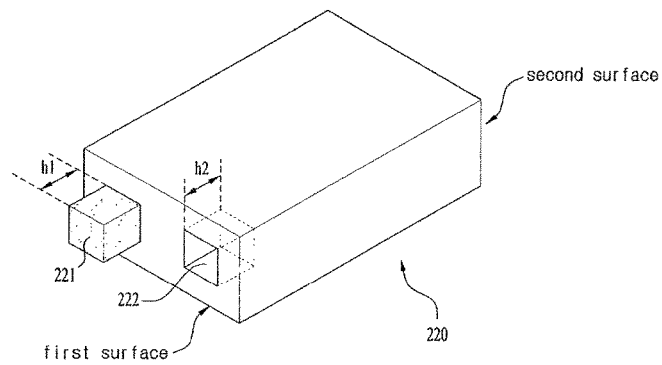
FIG. 3 is a perspective view illustrating one connector according to an embodiment.

FIG. 3 is a perspective view illustrating one connector according to an embodiment. FIG. 4A is a view illustrating the coupling of the connectors in FIG. 3. FIG. 4B is a view illustrating cross-sectional areas of a first protrusion and a first groove of the connector in FIG. 3.

A pair of connectors 220 according to an embodiment has the same shape, compared to those having different shapes in the related art, and may connect adjacent circuit boards. To this end, each connector has at least one pair consisting of a protrusion and a groove formed in one surface thereof, and a pair of connectors may be easily coupled to each other.

As illustrated in FIG. 3, each of the connectors 220 has a first protrusion 221 and a first groove 222 formed in the first surface thereof. The first protrusion 221 and the first groove 222 are arranged adjacent to each other, and serve to easily fasten the connectors 220. Alternatively, a greater number of protrusions and grooves may be formed in the first surface.

A second surface facing the first surface is directed toward a light emitting device package in a circuit board module to be described later, and no protrusion or groove may be formed on or in the second surface. A pair of terminals may be inserted into each of the connectors 220, to electrically connect circuit board modules provided with the connectors. The terminals are illustrated in FIG. 4A and elsewhere.

Each first protrusion 221 may have a height h1 greater than the depth h2 of each first groove 222. Accordingly, when all of the first protrusions 221 are inserted into the first grooves 222, the connectors 220 may be stably coupled to each other.

When the first protrusion 221 and the first groove 222 in one connector are symmetrically arranged on the center of the first surface thereof, the connectors 220 may be coupled in the state in which their edges coincide with each other.

Although each of the first protrusion 221 and the first groove 222 is illustrated as having a square cross-section in FIG. 3, the present invention is not limited thereto. For example, it may have a circular or polygonal shape. The first groove 222 must have a cross-sectional shape that is the inverse of that of the first protrusion 221, so that the first protrusion 221 may be inserted into the first groove 222.

The pair of connectors 220 is illustrated in FIG. 4A. Each of the connectors 220 is provided with a first terminal 231 and a second terminal 232. The first and second terminals 231 and 232 serve to electrically connect adjacent circuit board modules, and the shapes of the terminals are not limited to those illustrated in FIG. 4A and elsewhere.

Current having different polarities may flow in the first and second terminals 231 and 232. The first terminal 231 may be arranged to correspond to the first protrusion 221, and the second terminal 232 may be arranged to correspond to the first groove 222.

Here, "corresponding arrangement" means that one end of the first terminal 231 may be placed adjacent to the first protrusion 221, and one end of the second terminal 232 may be placed adjacent to the first groove 222.

As illustrated in FIG. 4A, the connectors 220 are coupled to each other by approaching in the directions indicated by the arrows. In this case, the first terminals 231 may be electrically connected to the second terminals 232 by coupling the first protrusions 221 to the first grooves 222.

In this case, the first terminal 231 of one connector 220 illustrated in the upper portion of FIG. 4A may be connected to the second terminal 232 of the other connector 220 illustrated in the lower portion thereof, and the second terminal 232 of one connector 220 illustrated in the upper portion thereof may be connected to the first terminal 231 of the other connector 220 illustrated in the lower portion thereof. The arrangement of the first and second terminals 231 and 232 in each connector 220 is not limited to that illustrated in FIG. 4A, and various examples are illustrated in FIGS. 7A and 7B.

FIG. 4B illustrates a state in which the first protrusion 221 is inserted into the first groove 222. The first groove must have a cross-sectional area that is equal to or greater than that of the first protrusion 221, so that the first protrusion 221 may be stably inserted into the first groove 222.

FIGS. 5A and 5B are views illustrating the shape of the first protrusion of the connector in FIG. 3 in detail. FIGS. 6A and 6B are views illustrating the shape of the first groove of the connector in FIG. 3 in detail.

As illustrated in FIG. 5A, the first protrusion 221 is disposed on the first surface of the connector 220, and has an open region 221a formed therein. The open region 221a may extend to the second surface through the connector 220. Although not shown in the drawing, the first terminal of the connector may be inserted into the open region 221a so as to be disposed therein.

As illustrated in FIG. 5A, the second terminal of an adjacent connector may be inserted into the open region 221a on the surface of the first protrusion 221, as will be described later. In this case, the open region 221 may have a cross-sectional area that is greater than that of the second terminal.

As illustrated in FIG. 5B, the first protrusion 221 is disposed on the first surface of the connector 220, and has the open region 221a formed therein. The first terminal 231 protrudes from the open region 221a. The protruding first terminal 231 may be inserted into another open region formed in the first groove of an adjacent connector, as will be described later.

As illustrated in FIG. 6A, the first groove 222 is disposed in the first surface of the connector 220, and an open region 222a is formed inside the first groove 222. The open region 222a may extend to the second surface through the connector 220. Although not shown in the drawing, the second terminal of the connector may be inserted into a portion of the open region 222a so as to be disposed therein.

When the pair of connectors is coupled to each other, as will be described later, the first protrusion of an adjacent connector may be inserted into the first groove 222 illustrated in FIG. 6A. In this case, the first terminal protruding from the adjacent protrusion may be inserted into the open region 222a inside the first groove 222.

As illustrated in FIG. 6B, the first groove 222 is disposed in the first surface of the connector 220, and the open region 222a is formed inside the first groove 222. The second terminal 232 protrudes from the open region 222a and extends to a portion of the first groove 222. As will be described later, when the connector having the structure illustrated in FIG. 6B is coupled to an adjacent connector, the first protrusion of the adjacent connector is inserted into the first groove 222, and the second terminal 232 protruding from the first groove 222 may be inserted into the open region formed in the first protrusion.

FIGS. 7A and 7B are views illustrating the coupling of the first protrusion and the first groove in FIGS. 5A to 6B.

As illustrated in FIG. 7A, the first terminal 231 protrudes from the first protrusion 221 of one connector 220, and is inserted into the open region 222a adjacent to the first groove 222 of the other connector 220.

As illustrated in FIG. 7B, the open region 221a is formed in the first protrusion 221 of one connector 220, and the second terminal 232 protruding from the first groove 222 of the other connector 220 adjacent thereto is inserted into the open region 221a formed in the first protrusion 221.

Although FIGS. 7A and 7B illustrate a portion of each of the open regions 221a and 222a, for the convenience of understanding, the open regions 221a and 222a are arranged through the connectors 222, and first and second terminals 231 and 232 may be disposed in the open regions 221a and 222a. In addition, although FIGS. 7A and 7B illustrate that only a portion of each of the first and second terminals 231 and 232 protrudes, the first and second terminals 231 and 232 may extend to the second surface facing the first surface.

When the first terminal 231 is inserted into the open region 222a in the first groove 222, the first terminal 231 may have a cross-sectional area that is equal to or smaller than that of the open region 222a. In addition, when the second terminal 232 is inserted into the open region 221a in the first protrusion 221, the second terminal 232 may have a cross-sectional area that is equal to or smaller than that of the open region 221a.

FIG. 8A is a view illustrating one circuit board module in which the connectors in FIG. 3 are arranged. FIG. 8B is a view illustrating the coupling of the circuit board modules in FIG. 8A.

At least one light emitting device package may be disposed on a circuit board 310. The light emitting device package may be formed such that a lens 350 surrounds a light emitting device 320 such as a light emitting diode.

Although not shown in the drawing, a first conductive pattern and a second conductive pattern are formed on the circuit board 310 so that current may flow in the light emitting device package.

As illustrated in the drawing, grooves are formed in first and second regions at both ends of the circuit board 310, and the above connectors may be inserted into the respective grooves and disposed therein.

In FIGS. 8A to 9, among adjacent circuit boards 310, the circuit board 310 arranged in one circuit board module 300a may be referred to as a first circuit board, and the circuit board 310 arranged in the other circuit board module 300b may be referred to as a second circuit board.

When the connectors disposed in the first and second regions of one circuit board are respectively referred to as a first connector and a second connector, the first terminal of the first connector may be electrically connected to the first conductive pattern on the circuit board 310, and the second terminal of the first connector may be electrically connected to the second conductive pattern on the circuit board 310.

In addition, the second terminal of the second connector may be electrically connected to the first conductive pattern on the circuit board 310, and the first terminal of the second connector may be electrically connected to the second conductive pattern on the circuit board 310.

As illustrated in FIG. 8B, one of connectors 220a disposed in one circuit board module 300a is coupled to an associated one of connectors 220b disposed in the other circuit board module 300b. Here, the coupling between the connectors 220a and 220b may be performed by the method described in FIGS. 7A and 7B.

FIG. 9 is a view illustrating a circuit board module array according to an embodiment.

When connectors 220a disposed in one circuit board module 300a are referred to as first connectors, and connectors 220b disposed in the other circuit board module 300b are referred to as second connectors, at least one of first protrusions and grooves of the first and second connectors 220a and 220b may be arranged so as to intersect with the longitudinal direction of an associated circuit board 310. Here, "intersecting" means that one of the first protrusions and grooves is arranged perpendicular to the longitudinal direction of the circuit board or is arranged nearly perpendicular thereto, and the following description is the same as above.

One of the first connectors 220a of one circuit board 310 is fastened to an associated one of the second connectors 220b of the other circuit board 310 adjacent thereto. The first protrusion of the first connector 220a may be inserted into the first groove of the second connector 220b, and the first protrusion of the second connector 220b may be inserted into the first groove of the first connector 220a. The coupling between the connectors may be performed by the method described in FIGS. 7A and 7B.

A first terminal of the first connector 220a may be electrically connected to a second terminal of the second connector 220b, and a second terminal of the first connector 220a may be electrically connected to a first terminal of the second connector 220b. The connection therebetween may be performed by the method described above.

The longitudinal direction of the circuit boards 310, i.e. the line connecting a pair of adjacent circuit boards in the longitudinal direction thereof, and the fastening direction of the connectors 220a and 220b, i.e. the fastening direction of the first and second connectors 220a and 220b, are the same as those illustrated in FIG. 9. The longitudinal direction, in which the adjacent circuit boards 310 come into contact with each other, may be perpendicular to the fastening direction of the connectors 220a and 220b. Here, "perpendicularity" may not mean exactly 90 degrees in the mathematical sense.

At least one of the first and second terminals of the first and second connectors 220a and 220b may be arranged perpendicular to the longitudinal direction of the circuit board 310. Here, "perpendicularity" may not mean exactly 90 degrees in the mathematical sense.

In the circuit board module array, the direction in which the adjacent circuit boards 310 come into contact with each other is approximately perpendicular to the coupling or fastening direction of the connectors 220a and 220b. Therefore, the fastening between the connectors 220a and 220b is not weak even when the circuit boards 310 thermally expand due to the current flowing in the circuit boards 310.

FIGS. 10A and 10B are views illustrating the wiring of the circuit board module array.

A plurality of light emitting devices may be interconnected in series on a circuit board. A first polar terminal connected to light emitting devices in one circuit board module is connected to a first polar terminal connected light emitting devices in the other circuit board module adjacent thereto. One connector CNT1 and the other connector CNT2 have the same structure in a single circuit board module, and may be arranged at both ends of the circuit board module.

FIGS. 11A to 11C are views illustrating various examples of circuit board module arrays.

The horizontal length of each circuit board module illustrated in FIG. 11A may be expressed as "X", the horizontal length of each circuit board module illustrated in FIG. 11B may be expressed as "Y", and the horizontal length of each circuit board module illustrated in FIG. 11C may be expressed as "Z". In this case, "X", "Y", and "Z" may be 390 mm, 440 mm, and 590 mm, respectively.

The horizontal lengths of the respective circuit board modules illustrated in FIGS. 11A to 11C and the numbers of light emitting devices arranged in the respective circuit board modules may differ from each other. However, one connector CNT1 and the other connector CNT2 have the same structure in each of the circuit board modules, and the circuit board modules may be coupled to each other.

FIGS. 12A to 12C are views illustrating a structure in which the circuit board module arrays in FIGS. 11A to 11C are arranged in a backlight unit.

FIG. 12A illustrates that the circuit board module arrays are arranged in the backlight unit of a 42-inch or 43-inch panel. The circuit board module arrays use connectors for circuit board modules, each having a horizontal length expressed as "X", and connectors for circuit board modules, each having a horizontal length expressed as "Y".

FIG. 12B illustrates that the circuit board module arrays are arranged in the backlight unit of a 47-inch or 43-inch panel. The circuit board module arrays use connectors for circuit board modules, each having a horizontal length expressed as "X", and connectors for circuit board modules, each having a horizontal length expressed as "Z".

FIG. 12C illustrates that the circuit board module arrays are arranged in the backlight unit of a 49-inch or 50-inch panel. The circuit board module arrays use connectors for circuit board modules, each having a horizontal length expressed as "Z", and connectors for circuit board modules, each having a horizontal length expressed as "Y".

As described above, since the connectors having the same structure are used at both sides of each of circuit board modules having different lengths, the circuit board modules may be interconnected and used for a single backlight unit.

In addition, since the three types of circuit board modules are compatibly used in the backlight units of panels having different screen sizes, there is no need to change the size of the circuit board module to match the size and aspect ratio of each individual panel.

Although embodiments have been described with reference to a number of illustrative embodiments thereof, it should be understood that numerous other modifications and applications may be devised by those skilled in the art that will fall within the intrinsic aspects of the embodiments.

More particularly, various variations and modifications are possible in concrete constituent elements of the embodiments. In addition, it is to be understood that differences relevant to the variations and modifications fall within the spirit and scope of the present disclosure defined in the appended claims.

INDUSTRIAL APPLICABILITY

A connector, and a circuit board module and a circuit board module array including the same according to embodiments can be used to supply current to light emitting devices or the like.

The invention claimed is:

1. A circuit board module comprising:
a circuit board formed with a first conductive pattern and a second conductive pattern; and
a first connector and a second connector disposed in a first region and a second region of the circuit board respectively,
wherein the first connector is electrically connected to the first conductive pattern, and the second connector is electrically connected to the second conductive pattern,
wherein a direction connecting the first connector and the second connector intersects a longitudinal direction of the circuit board,
wherein the first connector includes a first body, a first surface, a first protrusion having a sidewall and a top surface, and a first groove having a sidewall and a bottom surface, and the first protrusion is adjacent to the first groove,
wherein a shape of the first protrusion is an inverse of a shape of the first groove,
wherein a first open region is formed in the top surface of the first protrusion of the first connector and is spaced from the sidewall of the first protrusion,
wherein a first terminal extends from the bottom surface of the first groove and is spaced from the sidewall of the first groove,
wherein the second connector includes a second body, a second surface, a second protrusion having a sidewall and a top surface, and a second groove having a sidewall and a bottom surface, and the second protrusion is adjacent to the second groove,
wherein a shape of the second protrusion is an inverse of a shape of the second groove,
wherein a second open region is formed in the top surface of the second protrusion of the second connector and is spaced from the sidewall of the second protrusion,
wherein a second terminal extends from the bottom surface of the second groove and is spaced from the sidewall of the second groove,
wherein the first surface of the first connector faces with the second surface of the second connector,
wherein the second terminal of the second groove is inserted in the first open region of the first protrusion, and the first terminal of the first groove is inserted in the second open region of the second protrusion,
wherein the direction connecting the first connector and the second connector is parallel to a direction of the second terminal inserted in the first open region of the first protrusion and the first terminal inserted in the second open region of the second protrusion,
wherein the first groove is disposed in the first body and the second groove is disposed in the second body, and
wherein the first terminal does not extend out of the first body and the second terminal does not extend out of the second body.

2. The circuit board module according to claim 1, wherein the second terminal of the second connector is electrically connected to the second conductive pattern, and the first terminal of the first connector is electrically connected to the first conductive pattern.

3. The circuit board module according to claim 2, wherein the first protrusion and the first groove of the first connector and the second protrusion and the second groove of the second connector intersect the longitudinal direction of the circuit board.

4. The circuit board module according to claim 1, wherein the first terminal of the first connector and the second terminal of the second connector intersects a longitudinal direction of the circuit board.

5. The circuit board module according to claim 1, wherein the first protrusion has a height greater than a depth of the first groove.

6. The circuit board module according to claim 1, wherein the first protrusion and the first groove are symmetrically arranged on a center of the first surface.

7. The circuit board module according to claim 1, wherein the first open region of the first connector has a cross-sectional area greater than that of the second terminal.

8. The circuit board module according to claim 1, wherein the second open region of the second connector has a cross-sectional area greater than that of the first terminal.

9. The circuit board module according to claim 1, wherein currents having different polarities flow in the first and second terminals.

10. The circuit board module according to claim 1, wherein the first protrusion extends from the first surface and the first groove extends into the first surface,
wherein the sidewall of the first protrusion and the sidewall of the first groove are spaced from a perimeter of the first surface,
wherein the second protrusion extends from the second surface and the second groove extends into the second surface, and
wherein the sidewall of the second protrusion and the sidewall of the second groove are spaced from a perimeter of the second surface.

* * * * *